United States Patent [19]
Shinbara

[11] Patent Number: 5,302,864
[45] Date of Patent: Apr. 12, 1994

[54] ANALOG STANDARD CELL

[75] Inventor: Seitaro Shinbara, Yokomaha, Japan

[73] Assignee: Kabushiki Kaisha Toshiba, Tokyo, Japan

[21] Appl. No.: 921,360

[22] Filed: Jul. 27, 1992

Related U.S. Application Data

[63] Continuation of Ser. No. 678,244, Apr. 1, 1991, abandoned.

[30] Foreign Application Priority Data

Apr. 5, 1990 [JP] Japan ................................. 2-89141

[51] Int. Cl.$^5$ .......................... G06F 7/38; H01L 25/00
[52] U.S. Cl. .................................... 307/465; 307/466; 307/303.1
[58] Field of Search ................................ 307/475, 465

[56] References Cited

U.S. PATENT DOCUMENTS

| | | | |
|---|---|---|---|
| 4,551,642 | 11/1985 | Aizawa et al. | 307/264 |
| 4,641,108 | 2/1987 | Gill, Jr. | 330/257 |
| 4,670,673 | 6/1987 | Varadarajan | 307/475 |
| 4,677,312 | 6/1987 | Freeman | 307/264 |
| 4,698,527 | 10/1987 | Matsumoto | 307/475 |
| 4,734,654 | 3/1988 | Fernandez | 330/253 |
| 4,760,349 | 7/1988 | Park et al. | 330/264 |
| 4,771,191 | 9/1988 | Estrada | 307/475 |

OTHER PUBLICATIONS

Xilinx, "The Programmable Gate Array Design Handbook", First Edition, 1986, pp. 1-9-1-13.
Semicustom Linear Arrays Data Sheet, by Gennum Corporation, 21 pages. Document No. 500-67-4.
Information Notes, by Gennum Corporation, RF Analog Array GA9 11, 2 pages. Document No. 510-95-1.
Information Notes, by Gennum Corporation, GA911 Tile-Based Analog Semicustom Array, Document No. 520-14, 8 pages.
GaAs IC Data Book & Designer's Guide, by GigaBit Logic, (GBL), May 1988 6 pages.

*Primary Examiner*—Timothy P. Callahan
*Attorney, Agent, or Firm*—Banner, Birch, McKie & Beckett

[57] ABSTRACT

An analog standard cell includes a functional circuit portion and an interface circuit portion, the functional circuit portion being selected from a library of circuits having different circuit arrangements and an identical function, and the interface circuit portion being selected from a library of circuits having different circuit arrangements and an interface function, the interface circuit portion being arranged subsequent to the functional circuit to allow a predetermined output signal peak-to-peak level and a predetermined output DC bias level. The cell can be connected to a plurality of other cells to form an analog integrated circuit.

10 Claims, 2 Drawing Sheets

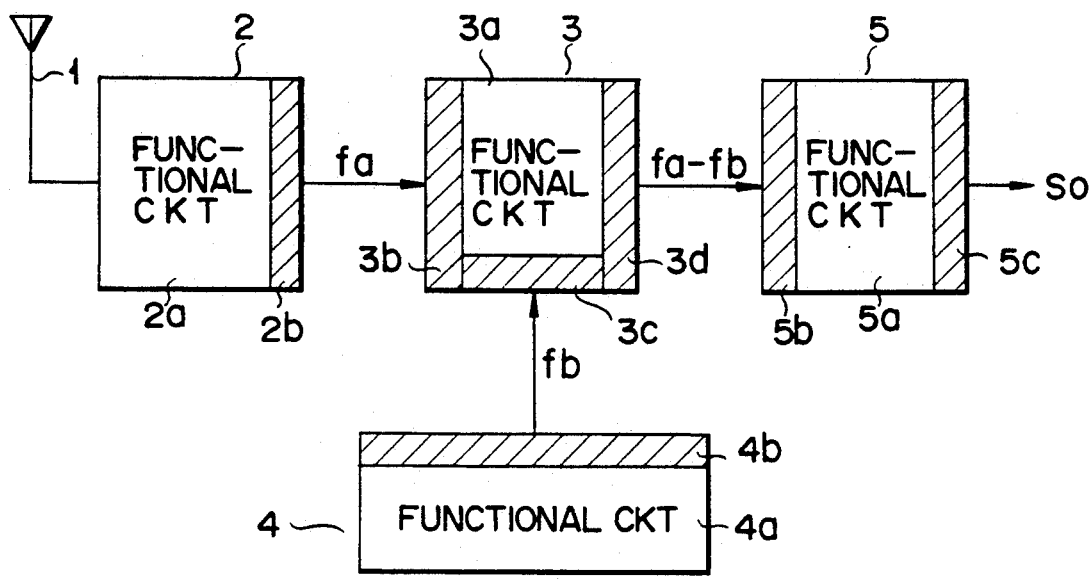
FIG. 1
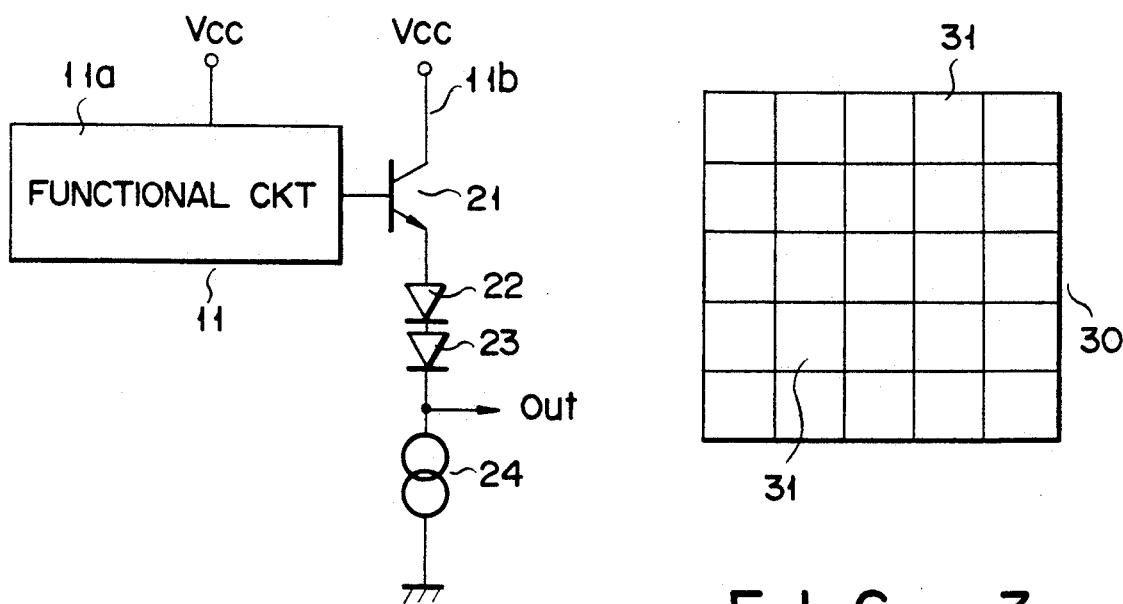
FIG. 2
FIG. 3

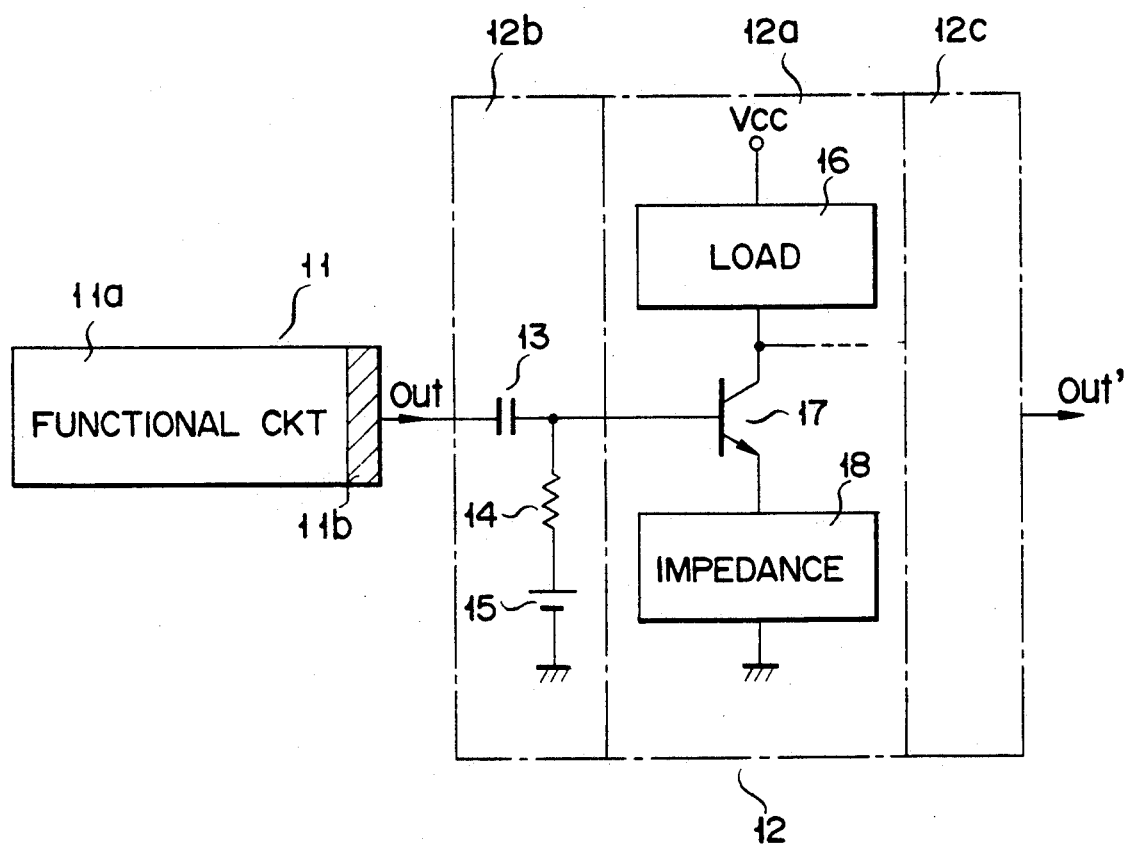
F I G. 4

ANALOG STANDARD CELL

This application is a continuation of application Ser. No. 07/678,244, filed Apr. 1, 1991, now abandoned.

BACKGROUND OF THE INVENTION

1. Field of the Invention

The present invention relates to an analog standard cell for processing an analog signal.

2. Description of the Related Art

Conventionally, to make an integrated analog circuit in divided cell units, different designers separately design respective functional blocks and combine the blocks in an integrated way to obtain the desired analog circuit. As this is done, there are different factors involved, such as that of an available power source voltage ($V_{cc}$) across the functional blocks, a DC bias voltage and signal levels involved. Since the respective blocks are to be combined as described above, a particular voltage level may be different from function block to function block and from cell to cell, even within a single function block. In such a situation, it becomes naturally difficult to obtain a superior circuit system. Each time a new circuit is to be produced, it has been necessary to do a separate corresponding circuit layout.

SUMMARY OF THE INVENTION

It is accordingly the object of the present invention to provide an analog standard cell which enables an improved analog circuit to be created by a simpler interface circuit design, even if different circuit designers design respective cells corresponding to respective function blocks.

According to the present invention, an analog standard cell comprises a cell including a functional circuit portion and interface circuit portion, the functional circuit portion being selected from a list of functional circuits, each particular circuit function having a plurality of different circuit arrangements, and the interface circuit portion being selected from a list of interface circuits, each having a different circuit arrangement and interface function, the interface circuit portion being arranged as a subsequent stage relative to the functional circuit portion to allow a predetermined output peak-to-peak signal level and a predetermined output DC bias level, a particular analog standard cell being connectable to at least one of a plurality of standard analog cells to form an analog integrated analog circuit.

That is, according to the present invention, signal processing is carried out in a selected cell with the use of the same power source voltage and signal level. The input and output sections of each cell are configured to allow the use of the same DC bias voltage. A circuit designer, after designing a cell circuit layout and registering its functional and interface circuits in a catalogue of available analog standard cells, can readily take other cells from the analog standard cell catalogue, perform a corresponding cell-to-cell connection and achieve a desired analog circuit. It is, therefore, not necessary to design the complete circuit with an aid of a skilled designer since only circuit functions need be selected from available analog standard cells and connected together.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic view showing one embodiment of the present invention.

FIG. 2 is a detailed circuit section corresponding to a section of one embodiment of the present invention.

FIG. 3 is a plan view showing an IC chip from which the circuit section is formed.

FIG. 4 shows details of a cell and next cell in FIG. 2.

DETAILED DESCRIPTION OF THE PREFERRED EMBODIMENTS

FIG. 1 shows a circuit arrangement of a receiver system which includes an embodiment of the present invention. Here, reference numeral 1 is an antenna and reference numeral 2 is an amplifier. The amplifier 2 includes a functional circuit portion 2a serving as an amplifier and interface circuit portion 2b. Reference numeral 3 is a mixer and reference numeral 4 is a local oscillation circuit. The mixer circuit 3 includes a functional circuit portion 3a serving as a mixer, an interface circuit portion 3b receiving a signal having a frequency fa from the interface circuit portion 2b of amplifier 2, an interface circuit portion 3c receiving a signal of frequency fb from the local oscillation circuit 4 and an interface circuit portion 3d for outputting a signal of frequency fa—fb. The oscillation circuit 4 includes a functional circuit portion 4a serving as an oscillator and interface circuit portion 4b for outputting signal of frequency fb. A buffer 5 includes a functional circuit portion 5a serving as a buffer, interface circuit portion 5b for receiving a signal from the mixer 3 and interface circuit portion 5c for outputting a buffer output So.

FIG. 2 is an analog standard detailed example of a cell including any one of the respective functional circuits portions shown in FIG. 1 and an interface circuit portion 11b on an output side. The cell in FIG. 2 may be considered, for example, as amplifier 2. In the interface circuit portion 11b, a transistor 21 has its collector connected to a common power source $V_{cc}$, its base connected to an output section of the functional circuit 11a portion and its emitter connected to ground via a series combination of diodes 22 and 23 and constant current source 24. The output of the interface circuit portion 11b is taken at a junction between the diode 23 and the constant current source 24.

FIG. 3 shows an example of an IC chip 30 having a plurality of analog standard cells 31. In this case, one of the cells may be any one of the cells 2 to 5 and 11, shown in FIGS. 1 and 2, and these cells 31, assembled together, provide a particular circuit arrangement, as shown in FIG. 1, on the IC chip 30.

In the aforementioned arrangement, cell-to-cell voltages are fixed to prescribed signal levels, for example, with the common voltage source $V_{cc}$ of the respective cell (functional circuit portion plus the interface circuit portion) set to, for example, 5 V, an input/output DC bias set to, for example, 2.5 V, and a peak-to-peak level of the input and output signals (between the cells 2 and 3, etc.) set to, for example, 0.5 V. In this case, it should be noted that, in the cell 2, an interface circuit portion between the IC and an external circuit, such as the antenna, requires a separate design layout because a signal level and DC voltage may be different from the cell-to-cell voltages associated with the interface circuit portion in the cells.

In FIG. 2, adjustments of a DC bias of the interface circuit portion 11b to a prescribed level may be done at diodes 22 and 23, but a resistor may be employed instead. That is, since a forward voltage $V_f$ across a diode is about 0.7 V, the number of diodes may be correspondingly selected for control. At that time, constant current source 24, having a high impedance, exerts no influence on an analog signal. Further, in order to design the functional circuit portion 11a to permit a peak-to-peak level of the analog signal to be set to the predetermined level, the characteristic value, constant, etc., of the circuitry of the functional circuit portion 11a may need to be accounted for.

In the aforementioned arrangement, cell 2 or 11 is designed that the common power source $V_{cc}$ and common signal level (peak-to-peak) peak) are set to the fixed levels, that is, 5 V and 0.5 V, respectively, in accordance with a functional circuit portion and interface circuit of a selected cell 2 or 11. (Cells 3 to 5 may be similarly considered in this case.) Since the cell-to-cell input and output are controlled with a common DC bias (=2.5 V in this case), a circuit layout can be designed simply taking into consideration the connection relation of a system configuration desired i.e., the order of functions required to produce a desired analog integrated circuit.

For example referring to FIGS. 1 and 2, if a circuit designer A designs a circuit, such as amplifier 2, having a functional circuit portion 11a using only a few circuit elements, designer A then designs interface circuit portion 11b to set the power source voltage $V_{cc}$, peak-to-peak signal level and DC bias voltage to corresponding predetermined levels to obtain a pair of circuit portions 2a' and 2b'. If another circuit designer B designs an amplifier 2 using a functional circuit portion 11a having better performance and somewhat more circuit element numbers than the amplifier designed by designer A, designer B then designs the interface circuit 11b to set the power source voltage $V_{cc}$, peak-to-peak signal level and DC bias voltage to corresponding predetermined levels to obtain a pair of circuits portions 2a'' and 2b''. That is, the functional circuit portion 2a, being formed by only a few circuit elements, is paired with the interface circuit portion 2b', while the functional circuit portion 2a'' is paired with the interface circuit portion 2b''.

According to the present embodiment thus arranged, the power source voltage of an interface circuit portion 11b, peak-to-peak level of an output signals and DC bias level to a next stage cell 12 are similarly set to corresponding fixed levels in a circuit as shown in FIG. 4, regardless whether any specific arrangement above is selected as the functional circuit portion 11a and interface circuit portion 11b. A circuit layout of, for example, the next stage cell 12 may be designed to connect an output which comes from the preceding-stage cell 11 directly to a functional circuit portion 12a in the next-stage cell 12 or, with an input DC level of the next-stage cell 12 blocked by a capacitor 13, as shown in FIG. 4. A bias level can be set for the functional circuit portion 12a by a bias circuit comprised of a resistor 14 and constant voltage source 15 in the interface circuit portion 12b, the functional circuit portion including an amplifier circuit comprising, for example, a load 16, transistor 17 and impedance 18. A circuit designer engaged in designing an analog standard cell for an analog integrated circuit in a semi-conductor chip can design his or her own circuit layout (cell circuit layout) by paying attention simply to obtaining a fixed output. The same thing can also be said in designing a cell circuit at any stage.

According to the present invention as set out above, it is only necessary to select a particular cell from a cell library for a desired cell function to effect a corresponding circuit design, thus significantly reducing the time between the initiation of the circuit design to the manufacturing of a corresponding integrated circuit. It is, therefore, possible to provide an analog standard cell having the aforementioned advantage.

What is claimed is:

1. An analog standard cell comprising:
a functional circuit portion and an interface circuit portion,
the functional circuit portion outputting a function output signal and comprising a predetermined circuit configuration for providing a predetermined analog circuit function, and
the interface circuit portion comprising a predetermined circuit configuration for providing an analog interface circuit, the analog interface circuit outputting an analog interface output signal corresponding to the function output signal, the analog interface output signal having a predetermined output peak-to-peak signal level and a predetermined output DC bias level,
wherein the analog standard cell formed by the functional circuit portion and the interface circuit portion is associated with a plurality of analog standard cells, each analog standard cell of the plurality of analog standard cells providing one of a plurality of predetermined analog functions and outputting a corresponding analog interface output signal, each analog interface output signal having the predetermined output peak-to-peak signal level and the predetermined output DC bias level, and
wherein the analog standard cell is connectable to at least one other analog standard cell of the plurality of analog standard cells to form an integrated analog circuit.

2. The analog standard cell according to claim 1 wherein said interface circuit portion includes:
a first NPN transistor having a collector coupled to a first power supply mode, a base coupled to the function output signal; and an emitter; and
a level shifting means, coupled to said emitter, for outputting said analog interface output signal.

3. The analog standard cell according to claim 2 wherein said level shifting means includes at least one diode having an anode coupled to the emitter and a cathode coupled to a constant current source.

4. The analog standard cell according to claim 1 wherein said functional circuit portion has an input portion for receiving signals having said predetermined output peak-to-peak signal level and said predetermined output DC bias level.

5. The analog standard cell according to claim 1, wherein the function output signal has the predetermined output peak-to-peak signal level.

6. An analog circuit comprising:

a first analog standard cell and a second analog standard cell, the first analog standard cell including a first functional circuit portion and a first interface circuit portion, the first functional circuit portion outputting a first function output signal and comprising a first predetermined circuit configuration for providing a first predetermined analog circuit function, and the first interface circuit portion comprising a first predetermined circuit configuration for providing a first analog interface circuit, the first analog interface circuit outputting a first analog interface output signal corresponding to the first function output signal, the first analog interface output signal having a first predetermined output peak-to-peak signal level and a first predetermined output DC bias level; and the second analog standard cell including a second functional circuit portion and a second interface circuit portion, the second functional circuit portion outputting a second function output signal and comprising a second predetermined circuit configuration for providing a second predetermined analog circuit function and a first input portion for receiving signals having the first predetermined output peak-to-peak signal level and the first predetermined output DC bias level, and the second interface circuit portion comprising a second predetermined circuit configuration for providing a second analog interface circuit, the second analog interface circuit outputting a second analog interface output signal corresponding to the second function output signal, the second analog interface output signal having the first predetermined output peak-to-peak signal level and the first predetermined output DC bias level;

wherein the analog circuit is formed by the first analog standard cell being connected to the second analog standard cell functional circuit portion so that the first input portion of the second functional circuit portion receives the first analog interface output signal from the first analog standard cell.

7. The analog circuit according to claim 6 further comprising a third analog standard cell including a third functional circuit portion and a third interface circuit portion, the third functional circuit portion outputting a third function output signal and comprising a third predetermined circuit configuration for providing a third predetermined analog circuit function and a second input portion for receiving signals having the first predetermined output peak-to-peak signal level and the first predetermined output DC bias level, and the third interface circuit portion comprising a third predetermined circuit configuration for providing a third analog interface circuit, the third analog interface circuit outputting a third analog interface output signal corresponding to the third function output signal, the third analog interface output signal having the first predetermined output peak-to-peak signal level and the first predetermined output DC bias level;

wherein the analog circuit is formed by the second analog standard cell being connected to the third analog standard cell functional circuit portion so that the second input portion of the third functional circuit portion receives the second analog interface output signal from the second analog standard cell.

8. The analog integrated circuit according to claim 6, wherein the first interface circuit portion of the first analog standard cell includes a first NPN transistor having a collector coupled to a first power supply node, a base coupled to the first function output signal, and a first emitter; and a first level shifting means, coupled to the first emitter, for outputting the first analog interface output signal.

9. The analog integrated circuit according to claim 8, wherein the second interface circuit portion of the second analog standard cell includes a second NPN transistor having a collector coupled to a second power supply node, a base coupled to the second function output signal, and a second emitter; and a second level shifting means, coupled to the second emitter, for outputting the second analog interface output signal.

10. The analog circuit according to claim 6, wherein the first function output signal has the first predetermined output peak-to-peak signal level and the second function output signal has the first predetermined output peak-to-peak signal level.

* * * * *